United States Patent
Locascio et al.

(10) Patent No.: US 7,524,746 B2
(45) Date of Patent: Apr. 28, 2009

(54) HIGH-REFRACTIVE INDEX MATERIALS COMPRISING SEMICONDUCTOR NANOCRYSTAL COMPOSITIONS, METHODS OF MAKING SAME, AND APPLICATIONS THEREFOR

(75) Inventors: Michael Locascio, Clifton Park, NY (US); Jennifer Gillies, Petersburg, NY (US); Margaret Hines, Troy, NY (US)

(73) Assignee: Evident Technologies, Inc., Troy, NY (US)

( * ) Notice: Subject to any disclaimer, the term of this patent is extended or adjusted under 35 U.S.C. 154(b) by 86 days.

(21) Appl. No.: 11/683,973

(22) Filed: Mar. 8, 2007

(65) Prior Publication Data

US 2007/0221947 A1 Sep. 27, 2007

Related U.S. Application Data

(60) Provisional application No. 60/781,360, filed on Mar. 13, 2006.

(51) Int. Cl.
*G02F 1/03* (2006.01)
(52) U.S. Cl. ...................... 438/584; 359/248
(58) Field of Classification Search .................. None
See application file for complete search history.

(56) References Cited

U.S. PATENT DOCUMENTS

| | | | | |
|---|---|---|---|---|
| 5,434,878 A * | 7/1995 | Lawandy | ............ | 372/43.01 |
| 5,508,829 A * | 4/1996 | Freeouf et al. | ............ | 359/3 |
| 6,005,707 A * | 12/1999 | Berggren et al. | ............ | 359/322 |
| 6,656,990 B2 | 12/2003 | Shustack et al. | | |
| 6,819,692 B2 * | 11/2004 | Klimov et al. | ............ | 372/39 |
| 7,438,833 B2 | 10/2008 | Whiteford et al. | | |
| 2003/0142944 A1 * | 7/2003 | Sundar et al. | ............ | 385/131 |

OTHER PUBLICATIONS

WIPO document, WO 2005/067524 A2, Nanosys, Inc., published in english on Jul. 28, 2005, 107 pages.*
Lu et al., "High refractive index thin films of ZnS/polythiourethane nanocomposites, Journal of Materials Chemistry", published Feb. 4, 2003.
PCT Notification Concerning Transmittal of International Preliminary Report on Patentability (Chapter 1 of the Patent Corporation Treaty) and Written Opinion of the International Searching Authority dated Aug. 14, 2008.

* cited by examiner

*Primary Examiner*—Alexander G Ghyka
*Assistant Examiner*—Reema Patel
(74) *Attorney, Agent, or Firm*—Kenyon & Kenyon LLP

(57) ABSTRACT

A high-refractive index material that includes semiconductor nanocrystal compositions. The high-refractive index material has at least one semiconductor nanocrystal composition incorporated in a matrix material and has a refractive index greater than 1.5. The semiconductor nanocrystal composition has a semiconductor nanocrystal core of a II-VI, III-V, or IV-VI semiconductor material. A method of making a high-refractive index material includes incorporating, at least one semiconductor nanocrystal composition in a matrix material. An application of a high-refractive index material includes incorporating at least one semiconductor nanocrystal composition in a matrix material to form the high-refractive index material and depositing the high-refractive index material on the surface of a lighting device.

19 Claims, 9 Drawing Sheets

HIGH-REFRACTIVE INDEX MATERIALS COMPRISING SEMICONDUCTOR NANOCRYSTAL COMPOSITIONS, METHODS OF MAKING SAME, AND APPLICATIONS THEREFOR

CROSS-REFERENCE TO RELATED APPLICATIONS

The present application claims priority to U.S. Provisional Application Ser. No. 60/781,360, filed Mar. 13, 2006, which is incorporated by reference herein.

FIELD OF THE INVENTION

The present invention relates to high-refractive index materials comprising semiconductor nanocrystal compositions, methods of making high-refractive index materials, and applications for high-refractive index materials.

BACKGROUND OF THE INVENTION

Drivers for the growth of high-quality, lighting devices, such as light-emitting diodes (LEDs), include demand for large screen televisions, outdoor/landscape lighting luminaries, interior illumination in the transportation sector (airplanes subways, ships, etc.), and in particular, automobiles. The demand for much higher-quality LEDs has begun to grow significantly and is expected to continue to grow as automotive manufacturers have committed to introducing models with LED forward lighting.

Since blue light-emitting diodes were first commercialized by Nichia in the mid-1990s, phosphor research and development programs at many companies have focused on re-examining their portfolios to discover materials compatible with ultraviolet (UV), violet, and blue LED wavelengths. General Electric (GE), Nichia, OSRAM (with its parent, Siemens, and with Symyx), Philips and Toyoda Gosei employ combinatorial analysis techniques to create, isolate, and test phosphor materials and morphologies.

Generally, in solid-state lighting devices, the LED is encapsulated in a suitable encapsulant. As a result, light-trapping due to Fresnel reflection and total internal reflection of photons generated within the LED at the chip-encapsulant interface currently limits the external quantum efficiencies of solid-state lighting devices to 30% of the potential efficiency. Although some of these losses are associated with absorption by the metal electrodes, phosphor losses, and losses by the reflector cup, the external quantum efficiency can be substantially enhanced by decreasing the light-trapping due to Fresnel reflection and total internal reflection, Both Fresnel reflection and total internal reflection are a result of the difference in refractive indices of the adjacent materials on each side of the chip-encapsulant interface. The greater the difference between the refractive indices of the underlying chip and the encapsulant, the larger the back reflection and the smaller the escape cone. This results in a reduced external quantum efficiency.

For example, current LEDs composed of indium-gallium-nitrogen have a refractive index of approximately 2.48. While typical encapsulants, such as silicone and/or epoxy, have a refractive index of approximately 1.5, in some cases 1.7. In the case of composite encapsulants, they typically have a refractive index equal to the volume average of their components provided that the components are significantly smaller than the wavelengths of light the encapsulant is designed to act upon. With the refractive index difference of 2.48 to 1.5 (or 1.7), there is a loss in the light extraction efficiency of the solid-state device comprising the LED and encapsulant.

Overall efficiency (in lumen/watt) and brightness (in lumen/device) of solid-state lighting devices can be significantly increased by improving the efficiency by which photons generated within the LED are extracted. One way to improve efficiency would be by improving the light extraction capability of the encapsulant.

An approach to this efficiency loss has to be use semiconductor nanocrystals in an encapsulant. Semiconductor nanocrystals may be generally comprised of spherical nanoscale crystalline II-VI, III-V, or IV-VI materials (although oblate and oblique spheroids can be grown as well as rods and other shapes) that have a diameter between 1 nanometer (nm) and 20 nm. In the strong confinement limit, the physical diameter of the nanocrystal is smaller than the bulk exciton Bohr radius causing quantum confinement effects to predominate. In strong confinement, the nanocrystal is a zero-dimensional system that has both quantized density and energy of electronic states where the actual energy and energy differences between those states are a function of both the nanocrystal composition and physical size (i.e. geometry). Larger nanocrystals have more closely spaced energy states and smaller nanocrystals have the reverse. Because interaction of light and matter is determined by the density and energy of electronic states, many of the optical and electric (optoelectric) properties of nanocrystals can be tuned or altered simply by changing the nanocrystal geometry (i.e. physical size).

Single nanocrystals or monodisperse populations of nanocrystals exhibit unique optical properties that are size tunable. Both the onset of absorption and the photoluminescent wavelength are a function of nanocrystal size and composition. The nanocrystals will absorb all wavelengths shorter than the absorption onset however, photoluminescence will always occur at the absorption onset. The bandwidth of the photoluminescent spectra is due to both homogeneous and inhomogeneous broadening mechanisms. Homogeneous mechanisms include temperature dependent Doppler broadening and broadening due to the Heisenberg uncertainty principle, while inhomogeneous broadening is due to the size distribution of the nanocrystals.

In an approach, metal oxide nanocrystals (i.e. zinc oxide, titanium oxide, etc.) have been dispersed in gelatin, polymer, silicone, epoxies, and sol-gels to form encapsulants. However, these nanocrystals have limited solubility in given matrix material and form micron-scale aggregates when their volume fraction within the matrix materials exceeds a few percent. These aggregates, in turn, strongly scatter light. As such, they would not be preferable as encapsulants for LEDs since they would strongly scatter the light emitted therefrom, making the solid-state device less efficient.

In another approach, soluble nanocrystals have been dispersed in polymer, etc., matrix material. However, these nanocrystals could be easily disrupted or destroyed in the presence of solvents and are unsuitable for many applications.

Shustack, et al., in U.S. Pat. No. 6,656,990, discloses a curable material including metal oxide nanocrystals in a matrix material. In the curable material, metal oxide nanocrystals are linked to a polymer matrix via metal-organic linking agents, where the metal atoms of the metal-organic linking agent link to the oxygen atoms of the metal oxide nanocrystals. Since metal oxides generally do not have a higher refractive index, the curable material incorporating the metal oxide nanocrystals typically can not achieve a refractive index sufficient to improve the light extraction efficiency of photons emitted by an LED in a solid-state device.

Lu, et al., in "High Refractive Index Thin Films of ZnS/Polythiourethane Nanocomposites," *J. Mater. Chem.*, 2003, 13, 526-530, discloses a high refractive index material including zinc sulfide (ZnS) in a matrix material. In making the high refractive index material, ZnS colloids are synthesized with ligands having hydroxyl functional groups that are linked to isocyanate function groups present on an oligomer backbone in the matrix material. There are several limitations to this approach. For example, using ligands having reactive functional groups as part of the synthesis process severely limits the types and reactive groups made available. This also prevents multiple types of functional groups being attached to the same nanocrystal or to different types of nanocrystals. Moreover, the required oligomer (i.e., polymer) backbone is incompatible with other approaches, such as nanocrystal cross linking, because the selected hydroxyl functional groups on one nanocrystal can not bond directly with the hydroxyl functional groups present on nearby nanocrystals. As such, this high refractive index material may not achieve a refractive index sufficient to improve the light extraction efficiency of photons emitted by an LED in a solid-state device.

Thus, there is a need in the art to develop a high-refractive index material to associate with a lighting device, thereby increasing the light extraction efficiency of the device.

SUMMARY OF THE INVENTION

In an embodiment, the present invention provides a high-refractive index material comprising at least one semiconductor nanocrystal composition incorporated in a matrix material, wherein the high-refractive index material has a refractive index greater than 1.5

In another embodiment, the present invention provides a method of making a high-refractive index material comprising incorporating a plurality of semiconductor nanocrystal compositions in a matrix material, wherein the high-refractive index material has a refractive index greater than 1.5.

In another embodiment, the present invention provides a method of making a high-refractive index material comprising assembling a layer of semiconductor nanocrystal compositions onto a substrate and sintering the layer to form a cohesive film on the substrate, wherein the high-refractive index material has a refractive index greater than 1.5.

In another embodiment, the present invention provides an application of a high-refractive index material comprising incorporating at least one semiconductor nanocrystal composition into a matrix material to form a high-refractive index material, wherein the high-refractive index material has a refractive index greater than 1.5, and depositing the high-refractive index material onto the surface of a lighting device.

DETAILED DESCRIPTION OF THE INVENTION

Figure 1:
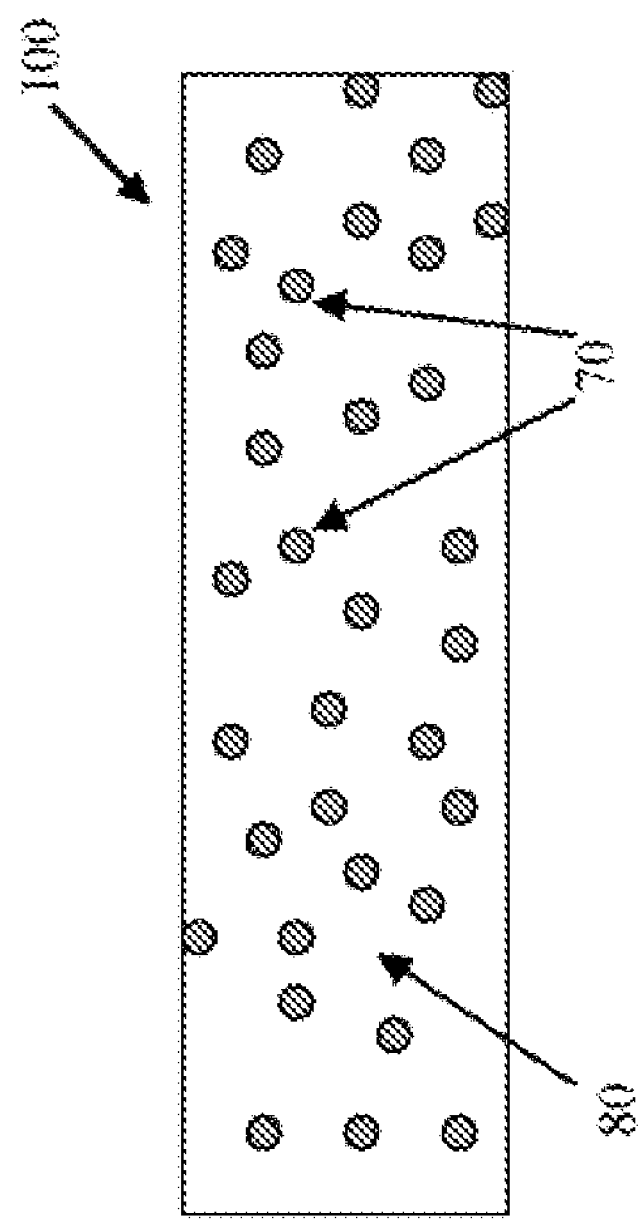
FIG. 1 is a schematic illustration of a high-refractive index material comprising semiconductor nanocrystal compositions according to an embodiment of the present invention.

Referring to FIG. 1, in an embodiment, the present invention provides a high-refractive index material 100 comprising semiconductor nanocrystal compositions 70 incorporated into a matrix material 80. Incorporating the nanocrystal compositions 70 in the matrix material 80 increases the overall refractive index of the resulting material 100. Although most conventional encapsulant materials have refractive indices no greater than 1.5, the inclusion of semiconductor nanocrystals at sufficiently higher concentrations raises the effective refractive index past 1.8.

The refractive index of the high-refractive index material 100 may be determined as follows:

$$n_{nanocrystal} x + n_{matrix}(1-x) = n_{material}$$

where $n_{nanocrystal}$, $n_{matrix}$, and $n_{material}$ are the refractive indices of the nanocrystal composition, the matrix material, and the high-refractive index material, respectively; and x is the concentration of the nanocrystal compositions by volume. The concentration of the nanocrystal compositions may be determined as follows:

$$x = (n_{material} - n_{matrix})/(n_{nanocrystal} - n_{matrix}).$$

Suppose, for example, that the matrix material has a refractive index of 1.5 and the nanocrystal composition has a refractive index of 2.545. Then, according to the above equations, the concentration of the nanocrystals in the high-refractive index material is 9.54% by volume. To achieve a refractive index of 1.7 for the high-refractive index material, the concentration of the nanocrystals would be approximately 19% by volume. For a refractive index of 1.8, approximately 28.5% by volume. As seen here, the concentration of nanocrystals needed to increase the refractive index of the matrix by even 0.1 is greater than 10% loading.

The high-refractive index material 100 of the present invention may possess one or more of the following characteristics:

1) A high-refractive index . . . The refractive index of the high-refractive index material is preferably greater than 1.5 at wavelengths equal to or greater than 450 nm. More preferably, the refractive index is greater than 1.7. Most preferably, the refractive index is greater than 1.8.

2) Low optical scattering . . . The optical scattering of the high-refractive index material is low. The nanocrystals themselves may be made such that they would not substantially scatter the light emitted by an underlying solid-state lighting device (e.g., LED, solid-state laser, etc.). The high quantum dot concentrations required to achieve high refractivity can lead to aggregation. Once aggregated, these nanocrystals would tend to scatter light. Thus in order to achieve low optical scattering, the aggregation of nanocrystals is minimized. Additionally, it has been found that if the dispersing particles, e.g., the nanocrystals, are less than approximately one-tenth the wavelength of light, Mie scattering is typically insignificant.

3) Low absorption percentage . . . In certain embodiments, the high-refractive index material is substantially non-absorbent to the wavelength of the underlying solid-state lighting device. Preferably the high-refractive index material is substantially non-absorbent to light at wavelengths emitted by the device at about 460 nm or 470 nm (blue light). More preferably, the high-refractive index material is substantially non-absorbent to light at wavelengths emitted by the device between about 380 nm and about 700 nm, which is the range used with most common LED chips. In certain embodiments, the high-refractive index material may include more than one type of nanocrystal composition, where one type is photoluminescent. The photoluminescent nanocrystal compositions may absorb a portion of incident light from the underlying LED or any other emitting light source at one wavelength. The photoluminescent nanocrystal compositions may then emit the light at a second wavelength, preferably a longer wavelength. As such, the high-refractive index material may both provide a high refractive index to improve the light extraction efficiency of an underlying LED and act as a down-converting phosphor.

4) Long operational lifetime . . . in certain embodiments, the high-refractive index material maintains its refractive index properties, low scattering properties, and low absorption properties for more than 5,000 hours. More preferably, the high-refractive index material maintains its refractive index properties for more than 20,000 hours. Most preferably, the high-refractive index material maintains its properties for more than 40,000 hours. The long operational lifetime indicates that the semiconductor nanocrystals can be manipulated into useful applications without losing their functioning properties.

Additionally, it is preferable that the high-refractive index material does not contain cadmium, lead, mercury, arsenic, antimony, selenium or other heavy metals. Although not necessary for the practice of the preset invention, the market acceptance of products containing many of the elements identified above are heavily regulated due to potential health concern.

The high-refractive index material 100 can be applied to and cured on the surface of a solid-state lighting device, e.g., an LED die, and can increase the light extraction quantum efficiency by reducing Fresnel reflection and increasing the solid angle at which light can escape the device. By implication, increasing the extraction quantum efficiency will increase the overall efficiency of the solid-state lighting device.

The semiconductor nanocrystal compositions 70 of the present invention comprise a semiconductor nanocrystal core having an outer surface, where the outer surface is metal rich. The metal atoms in the metal rich outer surface may link to crosslinkable ligands having metal chelating group(s) of a matrix material incorporating the nanocrystals. For example, ZnS nanocrystals may be synthesized having a zinc rich outer surface.

The semiconductor nanocrystals typically, but not exclusively, may comprise II-VI, II-V, and IV-VI binary semiconductors. Non-limiting examples of a semiconductor nanocrystal core includes II-VI materials such as ZnS, ZnSe, ZnTe, CdS, CdSe, CdTe, HgS, HgSe, and HgTe; IV-VI materials such as PbS, PbSe, and PbTe; and III-V materials such as AlN, AlP, AlAs, AlSb, GaN, GaP, GaAs, GaSb, InN, InP, InAs, and InSb. In addition to binary semiconductors, semiconductor nanocrystal cores may comprise ternary, quaternary, and quintary semiconductor materials. Non-limiting examples of ternary, quaternary, or quintary semiconductor materials include $A_xB_yC_zD_wE_{2v}$ wherein A and/or B may comprise a group I and/or VII element, and C and D may comprise a group III, VI and/or V element although C and D cannot both be group V elements, and E may comprise a VI element, and x, y, z, w, and v are molar fractions between 0 and 1. The semiconductor nanocrystal cores may also comprise group alloyed semiconductor materials.

The diameter of the semiconductor nanocrystals should be selected such that the resulting particles should not scatter the wavelengths of light emitted by the underlying solid-state lighting device. Mie scattering may be evident when the scattering elements are more than $\frac{1}{10}$ the wavelength of the light. Therefore, if an underlying LED emits blue light at wavelengths between about 450 nm to about 470 nm, the maximum diameter of the semiconductor nanocrystals in the high-refractive index material used as an encapsulant should be smaller than about 45 nm to about 47 nm. Similarly, for a violet LED emitting at wavelengths of about 405 nm, the maximum nanocrystal diameter should be about 40 nm. For an ultraviolet LED emitting at about 380 nm, the maximum nanocrystal diameter should be about 38 nm. For immersion type photolithography emitting at about 248 nm and about 193 nm the maximum nanocrystal diameters should be about 25 nm and about 19 nm, respectively.

In some embodiments, the semiconductor nanocrystal should be grown such that the underlying solid-state lighting device does not excite the semiconductor nanocrystals of the present invention. In other embodiments, the semiconductor nanocrystals should be grown to absorb some light from the underlying solid-state lighting device and re-emit the light at a second wavelength, preferably longer.

Different populations of nanocrystals comprising the high refractive index material may have different compositions, average size, or size distributions.

The surface chemistry of colloidal quantum dots can be readily assembled with metal chelating ligands having, organic moieties (one or two equal parts) required for either self-assembly or dispersion into polymeric matrix.

An example of the high-refractive index material of the present invention may be comprised of approximately 10-20 nm diameter zinc sulfide nanocrystals. Zinc sulfide (ZnS) nanocrystals, a II-VI semiconductor with a bulk refractive index of 2.545 at 400 nm, can be readily synthesized through proprietary solution-phase chemistry. Via ligand exchange procedures the ZnS quantum dot surfaces can be modified such that they are compatible with a epoxy and/or silicon matrix (i.e. capable of uniformly incorporating into epoxy and/or silicon at high concentrations without aggregation) and/or capable of crosslinking. The resultant nanocomposite may be deposited and cured onto solid-state lighting device surfaces and shown to increase the light extraction efficiency in comparison to bare and conventionally encapsulated solid-state lighting devices.

In another embodiment, the semiconductor nanocrystal composition 70 of the present invention comprises a semiconductor nanocrystal core having an outer surface and one or more metal layers grown on the outer surface after synthesis of the core. The metal layer may be approximately one or more monolayers thick. The metal atoms in the metal layer may link to crosslinkable ligands having metal chelating group(s) of a matrix material incorporating the nanocrystals. Non-limiting examples of metals that may be used to form the metal layer include Zn, Cd, Hg, Pb, Al, Ga, and In. For example, ZnS nanocrystals may be synthesized and then coated with zinc to form a zinc metal layer.

In another embodiment, the semiconductor nanocrystal composition 70 of the present invention comprises a semi conductor nanocrystal core having an outer surface and one or more shells grown on the outer surface. The outer surface of the core may be metal rich. The shells may provide for a type A semiconductor nanocrystal composition. Shells may comprise various and different semiconductor materials. Some examples include: CdSe, CdS, CdTe, ZnS, ZnSe, ZnTe, HgS, HgSe, HgTe, InP, InAs, InSb, InN, GaN, GaP, GaAs, GaSb, PbSe, PbS, and PbTe.

In another embodiment, the semiconductor nanocrystal composition 70 of the present invention comprises a semi-conductor nanocrystal core having an outer surface, one or more metal layers grown on the outer surface after synthesis of the core, and one or more shells grown on the metal layer (s).

Figure 2:
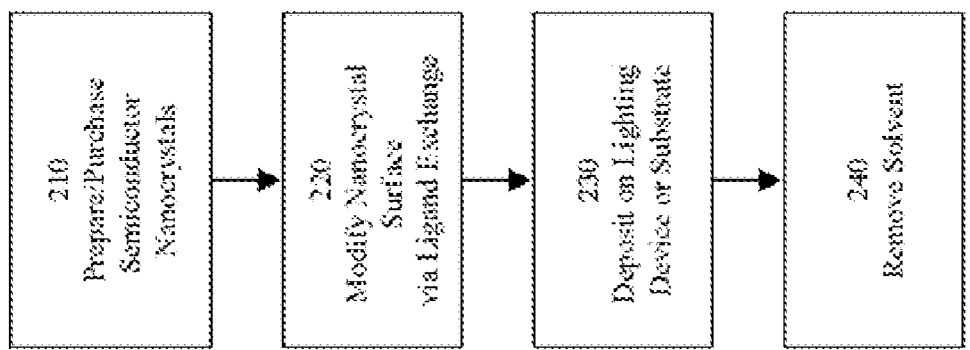
FIG. 2 is a flow chart illustrating a method of making a high-refractive index material comprising semiconductor nanocrystal compositions according to an embodiment of the present invention.

FIG. 2 provides an exemplary method of making a high-refractive index material of the present invention. In this method, the high-refractive index material is made by incorporating semiconductor nanocrystal compositions into a matrix material, where the semiconductor nanocrystal compositions are linked together via ligands with metal chelating groups.

In step 210, the semiconductor nanocrystal compositions are prepared. The nanocrystal compositions may have metal rich outer surfaces. For example purposes of the present invention, the semiconductor nanocrystal described will be ZnS or ZnSe semiconductor nanocrystals (quantum dots). To prepare the semiconductor nanocrystal compositions, organometallic precursors within a coordinating ligand solution are dissolved and dissociated. The precursors first nucleate, creating small particles that seed the growth of the semiconductor material. The remaining precursor feeds the growth of the particles. With controlled temperature and time, the reaction yields semi conductor nanocrystal particles of the desired average diameter.

Nanocrystals of core zinc sulfide (ZnS), a II-VI semiconductor, have been found to work well for the purposes of developing a high-refractive index material, although other semiconductors can be used. Both zinc and sulfur are environmentally benign. Although not a requirement for the purposes of the present invention, for commercial purposes, it is beneficial to have semiconductor nanocrystals that are not made of heavy metals. Additionally, bulk zinc sulfide (ZnS) has a refractive index of 2.545 at 400 nm and a bandgap energy of 3.6 eV. Neither bulk nor nanoscale ZnS will absorb photons having a wavelength greater than 345 nm. Therefore, these materials would be transparent to the light generated by many LED devices. Specifically, these particles are transparent to 460 nm, 405 nm, and 390 nm in InGaN LED devices. It is well established that quantum-sized effects occur only when the dimensions of the semiconductor (film thickness or particle diameter) are less than the excitation Bohr radius. Because the exciton Bohr radius of ZnS is 5.0 nm, particles of greater diameter should have the same refractive index as the bulk value.

An example synthesis preparation of zinc sulfide (ZnS) is as follow:

Elemental sulfur in an amount of 0.064 g (0.002 moles) and oleylamine in the amount of 2 ml (0.006 moles) is added to a vial and sonicated until the sulfur dissolves and the solution is uniform. The sulfur solution is a deep amber color.

Zinc oleate in an amount of 2.52 g (0.004 moles), oleic acid in an amount of 4 ml (0.013 moles), and oleylamine in an amount of 10 ml (0.03 moles) are added into a 25 ml round bottom flask and heated at 200° C. under nitrogen.

The sulfur solution is injected into the solution in the round bottom flask and the flask heated to the reaction temperature of 300° C. for 1 hour. The resulting solution becomes cloudy and its yellow color deepens. After 1 hour, the solution is removed from the heat and cooled to about 70° C.

Acetone in an amount of about 10 ml is added to the cooled solution and thoroughly stirred. Methanol in an amount of about 5-10 ml is added to the solution to completely precipitate the nanocrystals.

The mixture is centrifuged at 4,000×g and the supernatant decanted off.

The precipitate is washed with acetone to dissolve any unreacted Zinc oleate. The nanocrystals are re-dispersed in hexane.

A zinc metal layer may be added as follows.

Zinc oleate in an amount of 0.63 g is added to the nanocrystal-hexane mixture at room temperature.

Vacuum is applied and the mixture is heated to 180° C. for 30 minutes to form a zinc monolayer on the outer surface of the zinc sulfide nanocrystals.

The semiconductor nanocrystal compositions generated in this step are used in the high-refractive index nanocomposites developed in sub sequent steps.

In step 220, the ligands present on the surface of the semiconductor nanocrystals during preparation of the nanocrystals are modified through ligand exchange. For example, the ligands used during the synthesis of nanocrystals may be exchanged for ligands that allow for crosslinking via multifunctional ligands having a plurality of metal chelating groups. The multifunctional ligand may be selected such that it has more than one functional group that allows for the attachment with more than one nanocrystal (either through to the surface of the nanocrystal or to further ligands or moieties that may be present on the surface of the nanocrystals). Multifunctional ligands include polyamines and polythiols; however other ligands with more than one functional group may be used. Non-limiting examples of exemplary polyfunctional ligands include: 1,6 hexanedithiol, 2,2'-mercaptoethylsulfide, 2,butyl-2-ethyl-1,5-pentanediamine, and bis(hexamethylyne)triamine.

In this step 220, typically, the ligands used this preparation result in semiconductor nanocrystals with a ligand of TOPO or amine. These ligands are exchanged for diamine or dithiols crosslinking ligands. The desired crosslinking ligands are added to the solvent containing the nanocrystals. Applying heat gently under nitrogen, while stirring for several hours, results in a ligand exchange. It may be necessary to add excess amounts of the desired crosslinking ligand for the reaction to properly take place. Additionally, it may be necessary to draw the nanocrystals out of solution by washing them with methanol and repeating the addition of the desired crosslinking ligand.

In step 230, the resulting nanocrystal compositions are assembled onto a substrate or the surface of a solid-state lighting device by dispensing, a measured volume of solvated nanocrystals onto the substrate, then evaporating the solvent in step 240. Further heating in a vacuum oven results in the evaporation and removal of the reactive ligand leaving behind a high-refractive index material layer comprised of almost solely nanocrystals. This layer is subsequently overcoated with conventional epoxy and/or silicon encapsulant.

In this example, the ZnS or ZnSe nanocrystal with multifunctional ligands solution is assembled onto a substrate (including an LED surface) by dispensing a measured volume of solvated nanocrystals onto the substrate, then evaporating the solvent. Further heating in a vacuum oven results in the evaporation and removal of the solvent, leaving behind a high-refractive index material layer comprising crosslinked ZnS or ZnSe nanocrystals. Once dried, the nanocrystal layer may be further coated with acrylate and cured.

Figure 3:
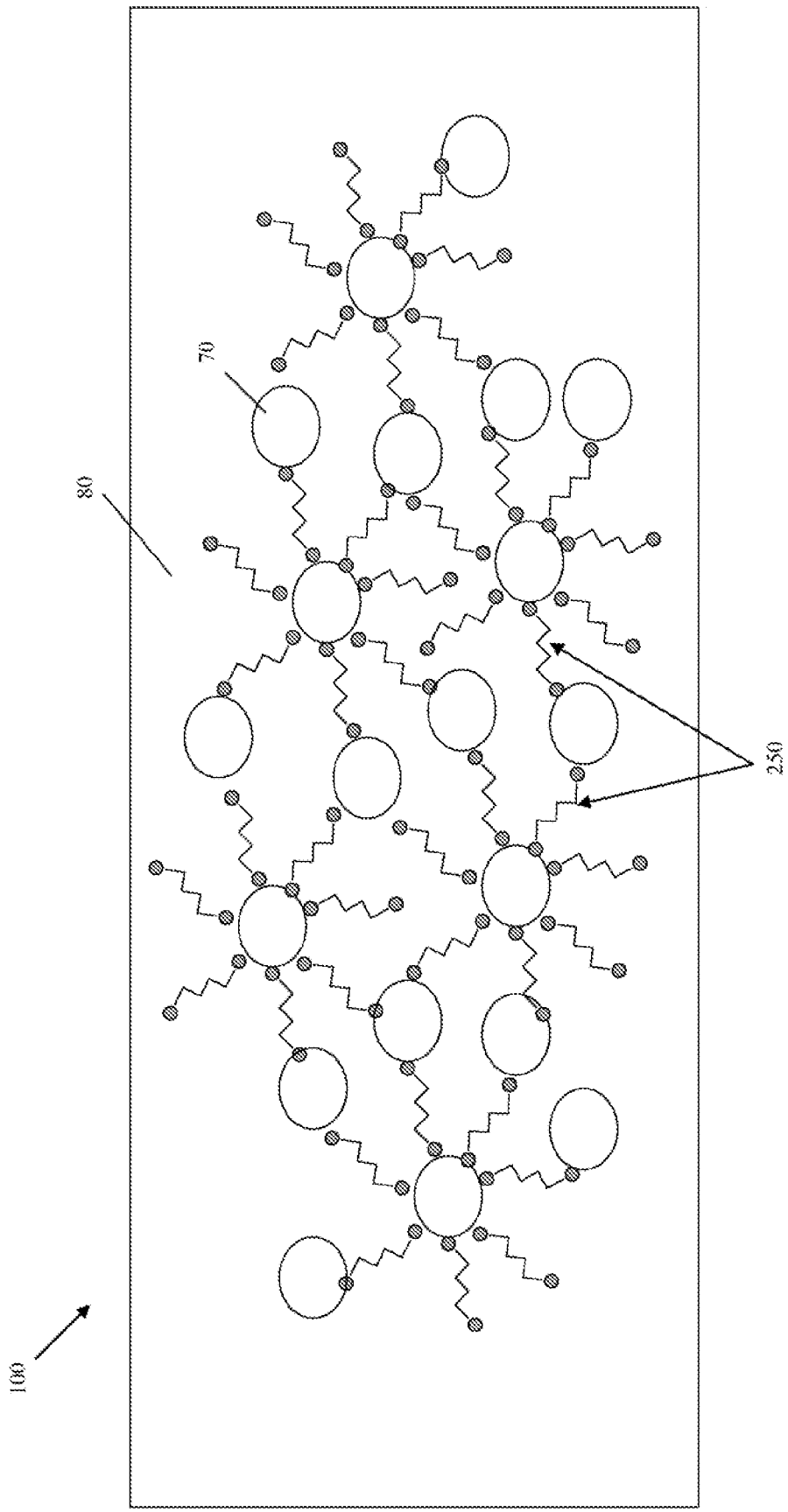
FIG. 3 is a schematic illustration of a high-refractive index material comprising semiconductor nanocrystal compositions according to another embodiment of the present invention.

Referring to FIG. 3, in another embodiment, the present invention provides a high-refractive index material 100 comprising semiconductor nanocrystal compositions 70 incorporated into a matrix material 80. The ligands used during synthesis of the nanocrystal compositions may be exchanged for crosslinkable ligands. Here, the multifunctional crosslinkable ligands having metal chelating groups 250 may be crosslinked with the nanocrystal compositions 70. The high-refractive index material 100 thus comprises semiconductor nanocrystal compositions 70 that are linked together in the matrix material 80 via ligands having metal chelating groups.

Figure 4:
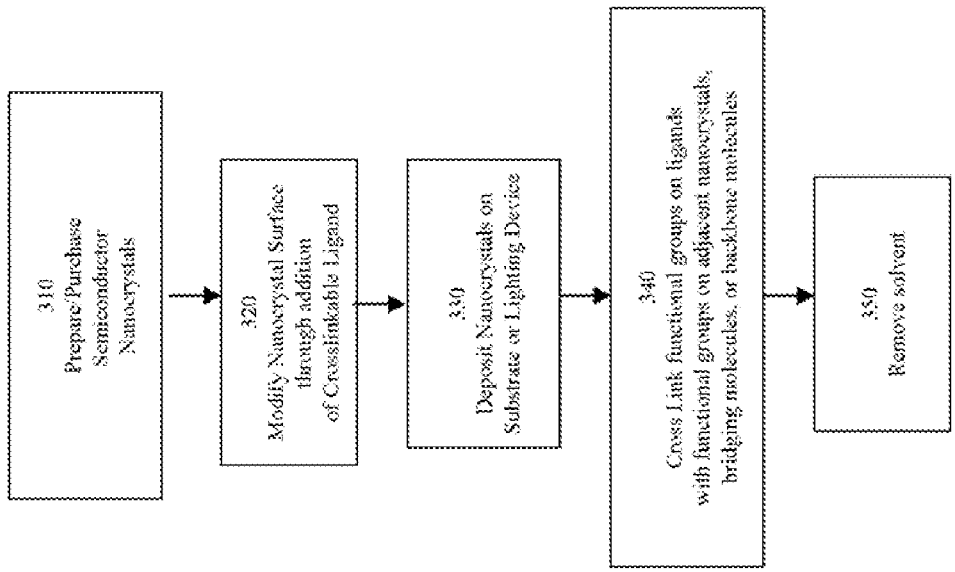
FIG. 4 is a flow chart illustrating a method of making a high-refractive index material comprising semiconductor nanocrystal compositions according to another embodiment of the present invention.

FIG. 4 provides another exemplary method of making a high-refractive index material of the present invention. In this method, the high-refractive index material is made by incorporating semiconductor nanocrystal compositions into a matrix material, where the semiconductor nanocrystal compositions are linked together by reacting functional groups present on ligands surrounding adjacent nanocrystal compositions or by reacting functional groups present on bridging molecules with functional groups present on ligands surrounding adjacent nanocrystal compositions or by reacting functional groups present on backbone molecules with functional groups present on ligands surrounding adjacent nanocrystal compositions. Each ligand, bridging molecule, and backbone molecule may have multiple functional groups that may be the same or different. Each nanocrystal composition may have multiple surrounding ligands that may be the same or different and/or may have the same or different functional groups.

In step 310, the semiconductor nanocrystal compositions are prepared as described above in step 210 of FIG. 2.

In step 320, the semiconductor nanocrystal compositions are modified by exchanging the ligands surrounding the nanocrystals after synthesis with ligands having one or more metal chelating groups (allowing for them to attach to the nanocrystal surface) and one or more reactive functional groups. Non-limiting, examples of metal chelating groups include amine, thiol, phosphine, phosphine oxide, and carboxyl. Non-limiting examples of reactive functional groups include amine, carboxyl, hydroxyl, isocyanate, carbonyl groups, thiol, epoxide, vinyl, acrylate, ketone, acyl, and anhydrides.

In an alternate embodiment, in step 320, the semiconductor nanocrystal compositions are modified by, in addition to exchanging the ligands, adding bridging molecules having functional groups capable of reacting with the functional groups present on the ligands surrounding the nanocrystals.

In another alternate embodiment, in step 320, the semiconductor nanocrystal compositions are modified by, in addition to exchanging the ligands, adding backbone molecules having functional groups capable of reacting with the functional groups present on the ligands surrounding the nanocrystals.

In step 330, the modified composition is applied to a substrate, e.g., an LED chip or any suitable substrate of a solid-state lighting device by dispensing a measured volume of solvated nanocrystals onto the substrate. For example, ZnS nanocrystal compositions may be deposited onto bare dies (mounted and wire bonded in reflector cups). A syringe pump micropipette, e.g., can be used to deposit varying volumes of the modified composition onto the lighting device.

In step 340, the functional groups on adjacent nanocrystals are reacted together forming bonds. In an alternate embodiment, the functional groups on bridging molecules are reacted with the functional groups on adjacent nanocrystals to form bonds. In another alternate embodiment, the functional groups on backbone molecules are reacted with the functional groups on adjacent nanocrystals to from bonds. The reaction may be initiated by a chemical, thermal, catalytic, radiative (ultraviolet), or other suitable stimulus to form covalent bonds between the functional groups. Non-limiting examples of the bonds formed include amide bonds, epoxide, thiourethane linkages, sulfur-carbon bonds.

In step 350, the solvent is evaporated from the substrate leaving behind a high-refractive index material layer comprised of almost solely nanocrystals.

An example of a reaction between functional groups on adjacent nanocrystal compositions is as follows:

The ligands surrounding some zinc sulfide (ZnS) nanocrystal compositions after synthesis are exchanged with ligands having one or more amino groups, e.g., 1-amino, 12-mercapto dodecane. The ligands surrounding other ZnS nanocrystal compositions after synthesis are exchanged with ligands having one or more carboxyl groups, e.g., mercapto undecanoic acid. The two sets of compositions are mixed together in solution and heated moderately with constant stirring. The amino and carboxyl functional groups react, thereby linking the nanocrystal compositions together.

An example of a reaction between functional groups on bridging molecules and functional groups on adjacent nanocrystal compositions is as follows:

The ligands surrounding ZnS nanocrystal compositions after synthesis are exchanged with a polythiol, e.g., 1,6 hexanedithiol or 2,2'-mercaptoethylsulfide. The modified compositions are dissolved in a solution with a diisocyanate, e.g., isophorone diisocyanate or toluenediisocyanate. A catalyst such as dibutyl tin laurate can be added in small amounts. The solution is heated moderately with constant stirring. The polythiol and diisocyanate functional groups react, thereby linking the nanocrystal compositions together. The solvent is evaporated to produce a ZnS-doped polythiourethane.

Examples of a reaction between functional groups on polymeric backbone molecules and functional groups on adjacent nanocrystal compositions are as follows:

In one example, the ligands surrounding ZnS nanocrystal compositions after synthesis are exchanged with a polythiol, e.g., 1,6 hexaneditihiol or 2,2-mercaptoethylsulfide. The modified compositions are added to a solution that includes polythiourethane oligomers. The solution is heated moderately with constant stirring. The polythiol and polythiourethane functional groups react, thereby linking the nanocrystal compositions together. The solvent is evaporated to produce a ZnS-doped polythiourethane.

In an alternate example, the ligands ZnS nanocrystal compositions after synthesis are exchanged with diamine ligands. The modified compositions are combined with an acrylate polymer, e.g., PMMA, Cn2600 from Sartomer, or polyurethane acrylate, in solution. Nucleophilic addition to the carbonyl carbon positions on the acrylate links ZnS to the polymer chain.

Figure 5:
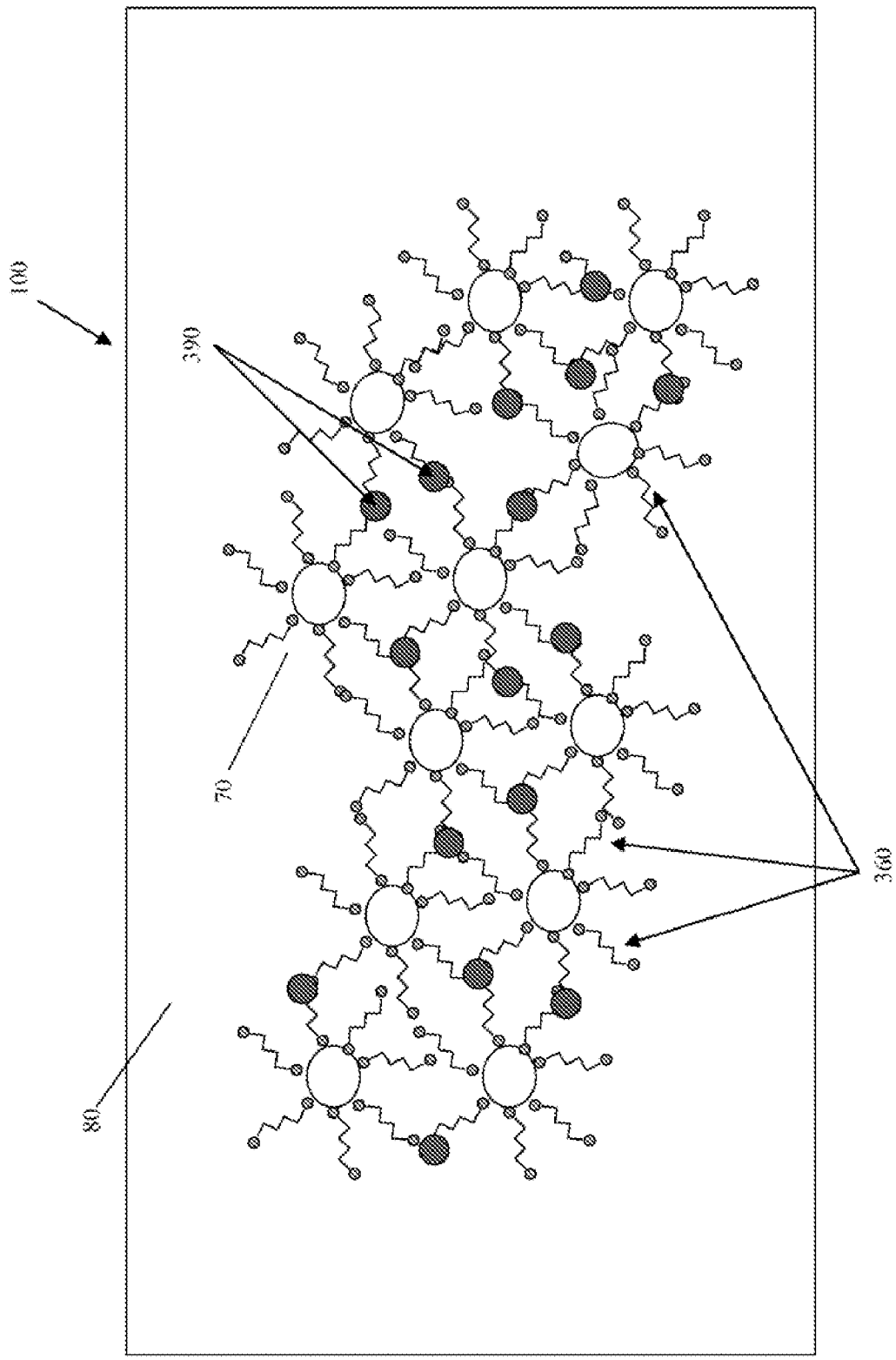
FIG. 5 is a schematic illustration of a high-refractive index material comprising semiconductor nanocrystal compositions according to another embodiment of the present invention.

Referring to FIG. 5, in another embodiment, the present invention provides a high-refractive index material 100 comprising semiconductor nanocrystal compositions 70 incorporated into a matrix material 80. The ligands used during synthesis of the nanocrystal compositions may be exchanged for ligands having one or more metal chelating groups, allowing the ligands to attach to the nanocrystal compositions, and one or more reactive functional groups 360. Here, the reactive functional groups 360 may react with each other to form bonds 390, thereby linking the nanocrystal compositions 70 to each other. The high-refractive index material 100 thus comprises semiconductor nanocrystal compositions 70 that are linked together in the matrix material 80 via ligands having reactive functional groups.

Figure 6:
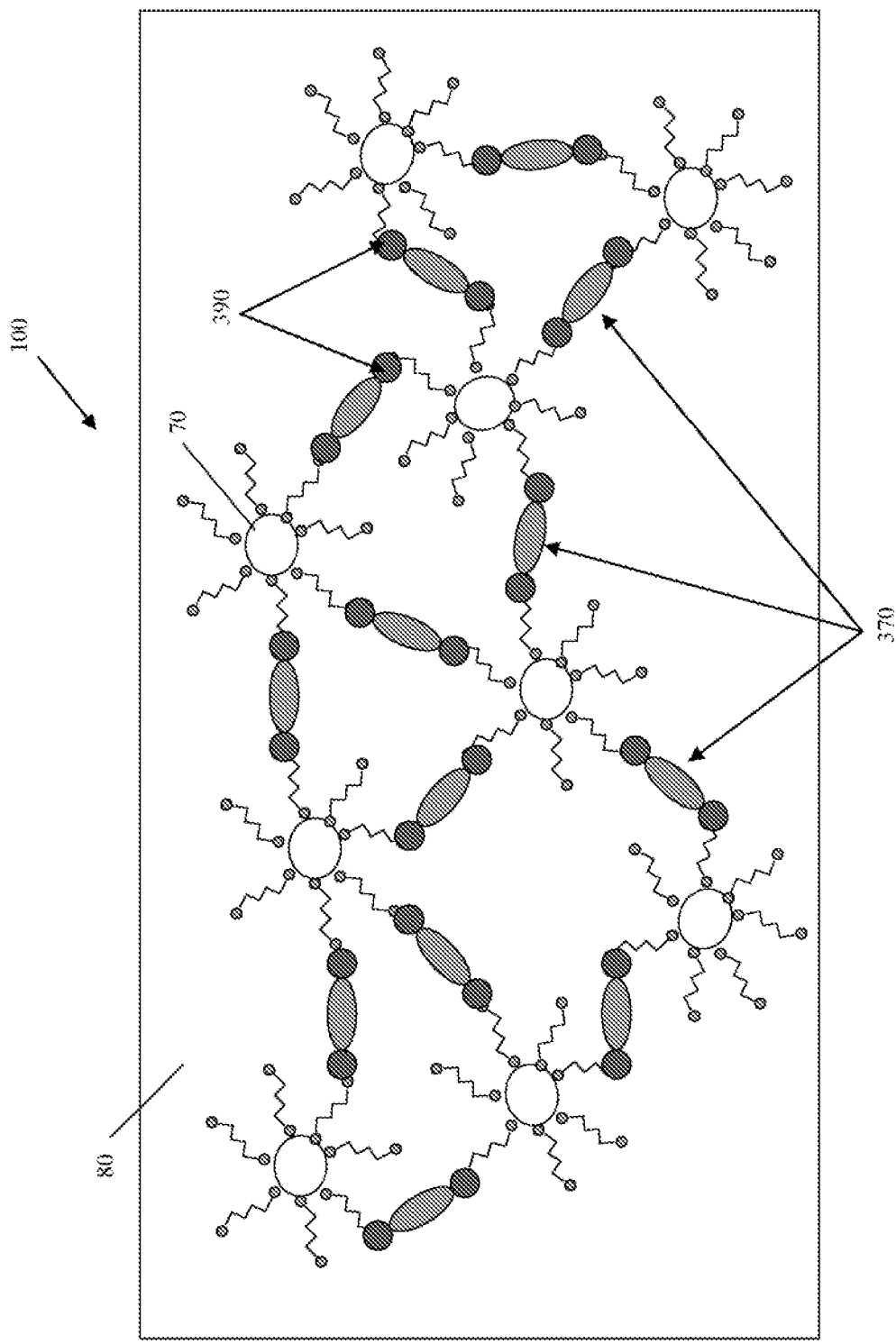
FIG. 6 is a schematic illustration of a high-refractive index material comprising semiconductor nanocrystal compositions according to another embodiment of the present invention.

Referring to FIG. 6, in another embodiment, the present invention provides a high-refractive index material 100 comprising semiconductor nanocrystal compositions 70 incorporated into a matrix material 80. The ligands used during synthesis of the nanocrystal compositions may be exchanged for ligands having one or more metal chelating groups, allowing the ligands to attach to the nanocrystal compositions, and one or more reactive functional groups 360, as shown in FIG. 5. Bridging molecules 370 having functional groups capable of reacting with the functional groups 360 of the ligands may be added. The ligand reactive functional groups 360 may react with the bridging molecule functional groups 370 to form bonds 390, thereby linking the nanocrystal compositions 70 to each other. The high-refractive index material 100 thus comprises semiconductor nanocrystal compositions 70 that are linked together in the matrix material 80 via functional groups of bridging molecules and ligands.

Figure 7:
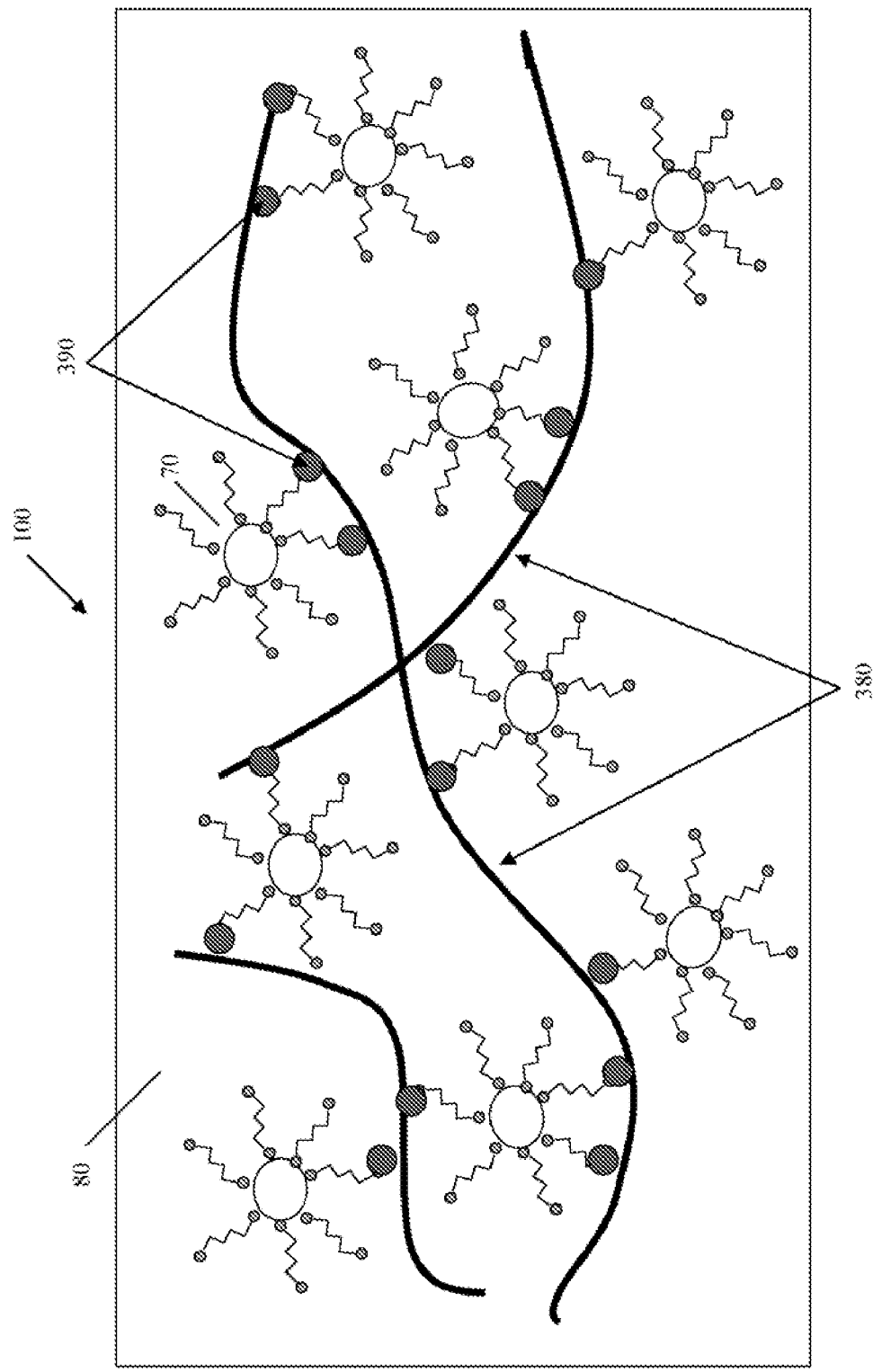
FIG. 7 is a schematic illustration of a high-refractive index material comprising semiconductor nanocrystal compositions according to another embodiment of the present invention.

Referring to FIG. 7, in another embodiment, the present invention provides a high-refractive index material 100 comprising semiconductor nanocrystal compositions 70 incorporated into a matrix material 80. The ligands used during synthesis of the nanocrystal compositions may be exchanged for ligands having one or more metal chelating groups, allowing the ligands to attach to the nanocrystal compositions, and one or more reactive functional groups 360, as shown in FIG. 5. Backbone molecules 380 having functional groups capable of reacting with the functional groups 360 of the ligands may be added. Here, the ligand reactive functional groups 360 may react with the backbone molecule functional groups 380 to form bonds 390, thereby linking the nanocrystal compositions 70 to each other. The high-refractive index material 100 thus comprises semiconductor nanocrystal compositions 70 that are linked together in the matrix material 80 via functional groups of backbone molecules and ligands.

Figure 8:
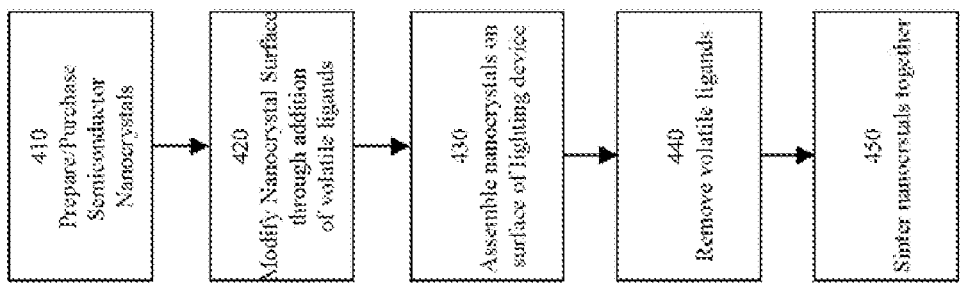
FIG. 8 is a flow chart illustrating a method of making a high-refractive index material comprising semiconductor nanocrystal compositions according to still another embodiment of the presents invention.

FIG. 8 provides another exemplary method of making a high-refractive index material of the present invention. In this method, the high-refractive index material is made by self-assembling a layer of semiconductor nanocrystal compositions onto a selected substrate followed by overcoating the semiconductor nanocrystal layer with a conventional encapsulant. The semiconductor nanocrystals with the associated ligands used during synthesis of the nanocrystals may be directly deposited onto glass substrates and subsequently overcoated with conventional encapsulants (such as silicon and epoxy).

In step 410, the semiconductor nanocrystal compositions are prepared as described above in step 210 of FIG. 2.

In step 420, the ligands present on the surface of the semiconductor nanocrystals during preparation are modified through ligand exchange by replacing these ligands with highly volatile ligands. For example, the ligands used during the synthesis of nanocrystals may be exchanged for ligands that are more volatile and easier to evaporate.

An example of semiconductor nanocrystal compositions made by the present invention is ZnS nanocrystals. In this step 420, ZnS nanocrystals having their original ligands used during synthesis (dispersed in solvent) are deposited onto glass slides with wells by pipetting a series of increasing volumes of a ZnS nanocrystals solution (at a fixed ZnS nanocrystal concentration of 10 mg/ml) into the well and evaporating off the solvent. As discussed above, a higher refractive index can be achieved by deposited a ZnS layer devoid of any ligand or host matrix. The ligands used during the synthesis of ZnS quantum dots are exchanged for pyridine ligands that are highly volatile.

In step 430, the resulting nanocrystal compositions are assembled onto a substrate or the surface of a solid-state lighting device by dispensing a measured volume of solvated nanocrystals onto the substrate.

In step 440, heating in a vacuum oven results in the evaporation and removal of the solvent and reactive highly volatile ligand, leaving behind a high-refractive index material layer comprised of almost solely nanocrystals.

In step 450, this layer is sintered to form a cohesive film by exposing the layer to elevated temperatures.

In this example, pyridine derivatized ZnS quantum dots are assembled onto a substrate (including an LED surface) by dispensing a measured volume of solvated nanocrystals onto the substrate, then evaporating the solvent. Further heating in a vacuum oven results in the evaporation and removal of the pyridine ligand, leaving behind a high-refractive index material layer comprising solely ZnS nanocrystals. Once dried, the nanocrystal layer is sintered to form a cohesive film by exposing the layer to elevated temperatures.

Figure 9:
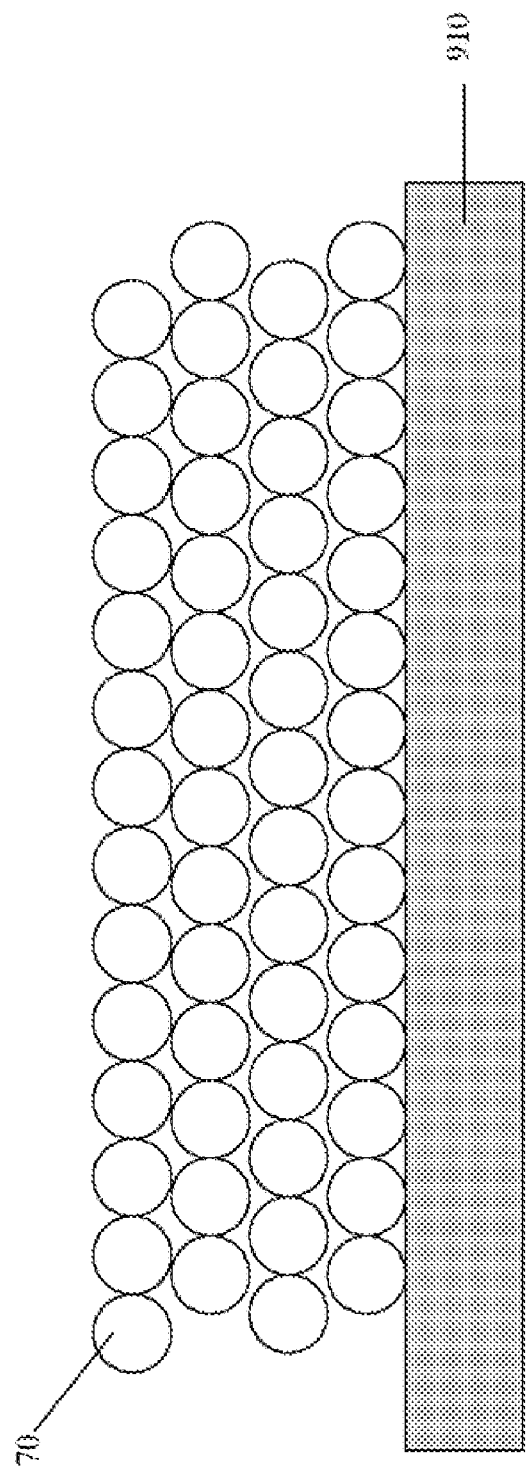
FIG. 9 is a schematic illustration of a high-refractive index material comprising semiconductor nanocrystal compositions according to another embodiments of the present invention.

Referring to FIG. 9, in anther embodiment, the present invention provides a high-refractive index material 100 comprising semiconductor nanocrystal compositions 70 self-assemble. The compositions 70 may be self-assembled on a substrate 910.

Efficacy (lumens per watt) of the high-refractive index material-coated lighting device can be measured at 20 mA using an in-house integrating sphere coupled to a fiber optic spectrometer and compared against the efficacy of bare lighting devices and lighting devices coated with a conventional encapsulant. In addition to efficacy measurements, the operational lifetime of the high-refractive index material-coated lighting device and the lighting device control samples may be determined by extrapolating the efficacy measured over 1000 hours at 20 mA.

In addition to solid-state lighting devices, a high-refractive index material may be used in immersion lithography in order to define finer features onto microelectronics devices during optical lithography processes. The high refractive index material may be used within microelectronics devices themselves as high-k dielectrics that result in reduced RC delay. The high refractive index material may further be used as thin films within a dielectric interference filter or as antireflective coatings on optical lenses windows etc.

The foregoing description has been set forth merely to illustrate the invention and is not intended as being limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Furthermore, all references cited herein are incorporated by reference in their entirety.

We claim:

1. A high-refractive index material comprising at least one semiconductor nanocrystal composition incorporated in a matrix material, wherein the high-refractive index material has a refractive index greater than 1.5, and wherein the semiconductor nanocrystal composition comprises:
(1) a semiconductor nanocrystal core comprising a II-VI, III-V, or IV-VI semiconductor material, the semiconductor nanocrystal core having an outer surface; and
(2) a metal layer grown on the outer surface of the semiconductor nanocrystal core, the metal layer having an outer surface.

2. The high-refractive index material of claim 1, wherein the high-refractive index material has a refractive index greater than 1.5 at a wavelength of at least about 450 nm.

3. The high-refractive index material of claim 1, wherein the high-refractive index material minimizes optical scattering.

4. The high-refractive index material of claim 1, wherein the high-refractive index material is substantially non-absorbent to light at wavelengths in the range of about 380 nm to about 700 nm.

5. The high-refractive index material of claim 1, wherein the high-refractive index material maintains the refractive index for more than about 5,000 hours.

6. The high-refractive index material of claim 1, wherein the semiconductor nanocrystal composition further comprises a shell layer comprising a semiconductor material grown on the outer surface of the metal layer.

7. The high-refractive index material of claim 1, wherein the semiconductor nanocrystal core comprises a binary semiconductor material.

8. The high-refractive index material of claim 7, wherein the semiconductor nanocrystal core comprises ZnS.

9. The high-refractive index material of claim 1, wherein the matrix material comprises a silicon, an epoxy, or a suitable combination thereof.

10. The high-refractive index material of claim 1, herein the concentration of the semiconductor nanocrystal composition incorporated in the matrix material is up to 90%.

11. A method of making a high-refractive index material, comprising incorporating a plurality of semiconductor nanocrystal compositions in a matrix material, wherein the high-refractive index material has a refractive index greater than 1.5, and wherein the incorporating comprises:
attaching metal chelating groups of ligands surrounding the semiconductor nanocrystal compositions to the surfaces of the semiconductor nanocrystal compositions; and
reacting functional groups of the attached ligands with each other to link the semiconductor nanocrystal compositions together in the matrix material.

12. A method of making a high-refractive index material, comprising incorporating a plurality of semiconductor nanocrystal compositions in a matrix material, wherein the high-refractive index material has a refractive index greater than 1.5 and the incorporating comprises:
attaching metal chelating groups of ligands surrounding the semiconductor nanocrystal compositions to the surfaces of the semiconductor nanocrystal compositions; and
reacting functional groups of the attached ligands with functional groups of bridging molecules to link the semiconductor nanocrystal compositions together in the matrix material.

13. A method of making a high-refractive index material, comprising incorporating a plurality of semiconductor nanocrystal compositions in a matrix material, wherein the high-refractive index material has a refractive index greater than 1.5 and the incorporating comprises:
attaching metal chelating groups of ligands surrounding the semiconductor nanocrystal compositions to the surfaces of the semiconductor nanocrystal compositions; and
reacting functional groups of the attached ligands with functional groups of backbone molecules to link the semiconductor nanocrystal compositions together in the matrix material.

14. A method of making a high-refractive index material comprising: assembling a layer of semiconductor nanocrystal compositions onto a substrate; and sintering the layer to form a cohesive film on the substrate wherein the high-refractive index material has a refractive index greater than 1.5.

15. A method of making a solid-state lighting device, comprising:
(1) incorporating at least one semiconductor nanocrystal compositions in a matrix material to form a high-refractive index material, wherein the high-refractive index material has a refractive index greater than 1.5, and wherein the incorporating comprises:
(a) attaching metal chelating groups of ligands surrounding the semiconductor nanocrystal compositions to the surfaces of the semiconductor nanocrystal compositions, and
(b) reacting functional groups of the attached ligands with each other to link the semiconductor nanocrystal compositions together in the matrix material; and
(2) depositing the high-refractive index material onto the surface of a lighting device.

16. A method of making a solid-state lighting device, comprising:
(1) incorporating at least one semiconductor nanocrystal compositions in a matrix material to form a high-refractive index material, wherein the high-refractive index material has a refractive index greater than 1.5, and wherein the incorporating comprises:
(a) attaching metal chelating groups of ligands surrounding the semiconductor nanocrystal compositions to the surfaces of the semiconductor nanocrystal compositions, and
(b) reacting functional groups of the attached ligands with functional groups of bridging molecules to link the semiconductor nanocrystal compositions together in the matrix material; and
(2) depositing the high-refractive index material onto the surface of a lighting device.

17. A method of making a solid-state lighting device, comprising:
(1) incorporating at least one semiconductor nanocrystal compositions in a matrix material to form a high-refractive index material, wherein the high-refractive index material has a refractive index greater than 1.5 , and wherein the incorporating comprises:
(a) attaching metal chelating groups of ligands surrounding the semiconductor nanocrystal compositions to the surfaces of the semiconductor nanocrystal compositions; and
(b) reacting functional groups of the attached ligands with functional groups of backbone molecules to link the semiconductor nanocrystal compositions together in the matrix material; and
(2) depositing the high-refractive index material onto the surface of a lighting device.

18. A high refractive index material comprising:
a plurality of semiconductor nanocrystal compositions incorporated in a matrix material, wherein the high-refractive index material has a refractive index greater than 1.5, and wherein the semiconductor nanocrystal compositions are linked through bonds between functional groups of metal chelating groups-containing ligands attached to the semiconductor nanocrystal compositions.

19. A high refractive index material comprising:
a plurality of semiconductor nanocrystal compositions incorporated in a matrix material, wherein the high-refractive index material has a refractive index greater than 1.5, and wherein the semiconductor nanocrystal compositions are linked through bonds between functional groups of metal chelating groups-containing ligands attached to the semiconductor nanocrystal compositions and bridging molecules.

* * * * *